United States Patent
Cliquennois

(10) Patent No.: US 8,537,047 B2
(45) Date of Patent: Sep. 17, 2013

(54) DIGITAL REQUANTIZATION PROCESS AND DEVICES

(75) Inventor: Sébastien Cliquennois, La Buisse (FR)

(73) Assignee: ST-Ericsson SA, Plan-les-Ouates (CH)

( * ) Notice: Subject to any disclaimer, the term of this patent is extended or adjusted under 35 U.S.C. 154(b) by 59 days.

(21) Appl. No.: 13/387,972

(22) PCT Filed: Jul. 26, 2010

(86) PCT No.: PCT/EP2010/060823
§ 371 (c)(1),
(2), (4) Date: Jan. 30, 2012

(87) PCT Pub. No.: WO2011/015486
PCT Pub. Date: Feb. 10, 2011

(65) Prior Publication Data
US 2012/0133531 A1    May 31, 2012

(30) Foreign Application Priority Data

Aug. 3, 2009   (FR) ..................... 09 55463

(51) Int. Cl.
*H03M 7/36*    (2006.01)
*G06F 7/50*    (2006.01)
*H02M 1/08*    (2006.01)

(52) U.S. Cl.
USPC .............. 341/200; 341/76; 708/551; 323/283

(58) Field of Classification Search
None
See application file for complete search history.

(56) References Cited

U.S. PATENT DOCUMENTS

| 6,513,055 | B1 * | 1/2003 | Boran ........................... 708/551 |
| 7,577,699 | B2 * | 8/2009 | Denk et al. ..................... 708/550 |
| 2008/0042632 | A1 * | 2/2008 | Chapuis et al. ............... 323/283 |

OTHER PUBLICATIONS

Angel Vladimirov Peterchev et al., "Digital Pulse-Width Modulation Control in Power Electronic Circuits: Theory and Applications", Internet Citation, Mar. 13, 2006, p. 177PP, XP007912568, Retrieved from the Internet: URL:http://www.eecs.berkeley.edu/Pubs/TechRpts/2006/EECS-2006-22.pdf [retrieved on Apr. 8, 2010] cited in the application pp. 57-58; figure 3.1; tables 3.1-3.2 pp. 66-73; figures 3.5-3.7.

* cited by examiner

*Primary Examiner* — Howard Williams
(74) *Attorney, Agent, or Firm* — Coats & Bennett, P.L.L.C.

(57) ABSTRACT

The invention relates to the digital signal requantization, at a given quantization step size, of a first word received in a first period of time and encoded in a first number of bits, into a second word, with a quantization error equal to a third number. A sequence of third words is outputted, equal to the second word, with the sequence subdivided into a first group comprising a number of third words that is equal to the third number and a second group of third words. Before outputting them, the correction means adds a least significant bit to the third words of the first group and adds or subtracts least significant bits to or from the third words of the second group, such that the sum of the least significant bits added to and subtracted from the second group is zero.

9 Claims, 1 Drawing Sheet

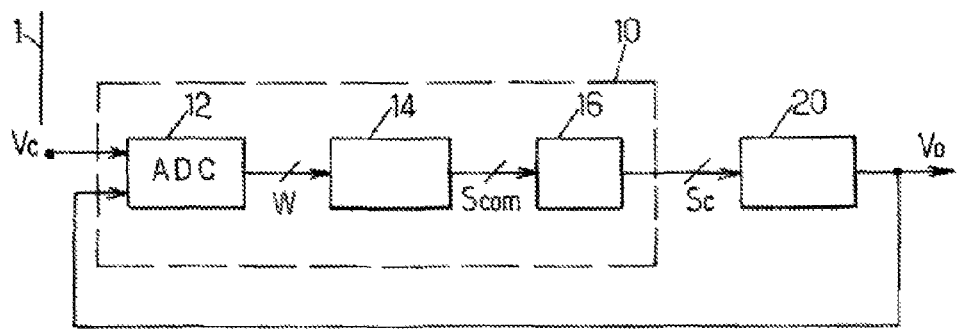
FIG.1.
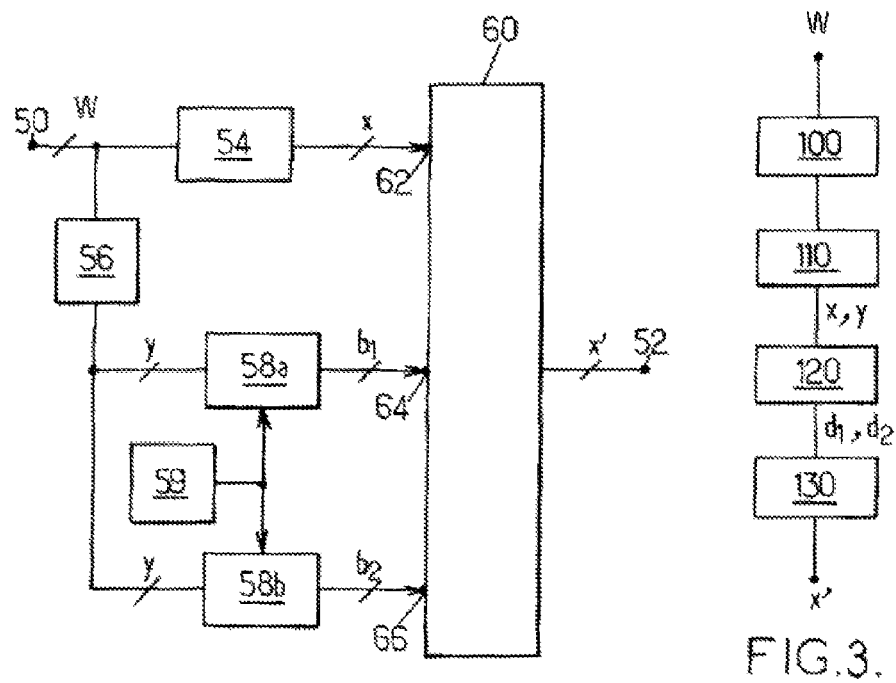
FIG.2.
FIG.3.

DIGITAL REQUANTIZATION PROCESS AND DEVICES

TECHNICAL DOMAIN

The present invention relates in general to the quantization of digital signals, and in particular to the reduction of undesirable low-frequency components introduced during this operation.

The invention has applications in particular in the implementation of controllers for switched-mode power supplies used, for example, in equipment comprising microprocessors, such as computers, embedded systems, etc. In such an application, the controller is intended to regulate the output voltage of the power supply.

TECHNOLOGICAL BACKGROUND

FIG. 1 shows a schematic diagram of a switched-mode power supply 1 able to output an electrical voltage signal $V_0$. The power supply 1 has a controller 10 comprising a first input for receiving the voltage $V_0$ and a second input for receiving a reference voltage $V_c$, and an output for outputting a control signal $S_c$. The controller 10 itself comprises an analog-to-digital converter 12, followed by a regulator 14 implementing a control law and a waveform generator 16. The power supply 1 further comprises a voltage generator 20 able to produce the electrical voltage signal $V_0$ as a function of the control signal $S_c$. The voltage generator 20 conventionally comprises a set of switches controlled by the signal produced by the waveform generator 16, and an inductor-capacitor filter or LC filter.

During operation, the voltage $V_0$ produced by the voltage generator 20 is compared to the reference voltage $V_c$ by the analog-to-digital converter 12, which quantifies in a digital word W the difference between the voltage $V_0$ and the reference voltage $V_c$. The regulator 14 determines, based on the digital word W and the control law, a command signal $S_{com}$ to correct the voltage $V_0$ such that the latter tends towards the reference voltage $V_c$. The command signal $S_{com}$ is then received by the waveform generator 16 which modifies the control signal Sc accordingly. The control signal acts in turn on the waveform output from the voltage generator 20 and therefore ultimately on the voltage $V_0$. Typically, the command signal $S_{com}$ is a number characterizing a duty ratio controlling a waveform generator 16 of the digital pulse-width modulator type.

In practice, the precision of the slaving of the voltage $V_0$ to the reference voltage $V_c$ is sensitive to the resolution at which the analog-to-digital converter 12 and especially the waveform generator 16 are likely to work, which typically can reach 11 bits at a frequency of 10 MHz. For technological and economic reasons, the use of a waveform generator 16 working at such high resolutions is not always practical.

In response to this problem, the sequence of digital words M produced by the analog-to-digital converter 12 can be requantized, by decreasing the resolution while limiting the number of bits used for each digital word W. Various algorithms allow performing this quantization efficiently, particularly the process known as dithering for which the implementation is described in the document entitled "Digital Pulse-Width Modulation Control in Power Electronic Circuits: Theory and Applications"—Angel Vladimirov Peterchev, Seth R. Sanders—Electrical Engineering and Computer Sciences—University of California at Berkeley—Technical Report No. UCB/EECS-2006-22—http://www.eecs.berkeley.edu/Pubs/TechRpts/2006/EECS-2006-22.html—Mar. 13, 2006.

Such a process is based on the principle of distributing quantization error corrections over a predetermined period of time, by periodically adding least significant bits to the signal so that the average of the signal approximates the average value over said period of the signal before quantization. The LC filter of the switched-mode power supply 1 then averages the quantization error corrections over time. In addition, the longer the period of time considered, the more noticeable the improvement in the resolution of the quantization operation.

The downside to this improvement is that the periodic production of error corrections is likely to introduce variations, called ripple, in the quantified signal. This ripple is sufficiently low in frequency that the LC filter of the switched-mode power supply 1 is not able to apply effective averaging.

In addition, the ripples produced by the dithering processes of the prior art are likely to combine with other faults in the switched-mode power supply 1, particularly the ripple introduced by control faults of the set of power switches. Ultimately, such dither ripple is detrimental to the overall precision of the signal that is output by the switched-mode power supply 1.

SUMMARY OF THE INVENTION

There is therefore a need to improve the situation.

A first aspect of the invention proposes a requantization device comprising
  an input for receiving, in a first period of time, a first word encoded in a first whole number of bits;
  a means for requantization, at a given quantization step size, of the first word into a second word in a second whole number of bits that is strictly less than the first whole number;
  a means for determining a third number equal to the value of a fourth number of least significant bits of the first word, with the fourth number being equal to the difference between the first whole number and the second whole number;
  an output for outputting, during a fourth number of periods following the first period of time, a sequence of third words each equal to the second word for the current period of time, with the sequence comprising a first group comprising a number of third words that is equal to the third number and a second group of third words distinct from the first group;
  a correction means configured to:
    add a least significant bit to the third words of the first group before outputting them;
    add or subtract least significant bits to/from the third words of the second group before outputting them, such that the sum of the least significant bits added to and subtracted from the third words of the second group is zero.

The correction means configured in this manner allows obtaining an output signal with an average value over the periods considered that is equal to the value of the first word. It therefore substantially compensates for the quantization error.

In addition, the correction means is designed to introduce overcorrections by adding least significant bits and undercorrections by subtracting least significant bits, with a cumulative effect that averages zero for the periods considered. However, these overcorrections and undercorrections allow increasing the number of transitions between the 0 and 1 digits of the output signal. From the introduction of these overcorrections and undercorrections there therefore results a large reduction in the low frequency harmonics of the output signal. In a switched-mode power supply, LC filtering is more effective and the amplitude of the ripples is greatly reduced.

In one embodiment, the correction means comprises:
  a counter for associating a sequential number with the current period of time;
  a first table, connected to the counter and comprising an input for receiving the third number, storing a first binary pattern for each possible value of the third number, with said first table able to deliver a first bit corresponding to the bit whose position in the first binary pattern corresponding to the third number received is equal to the sequential number;
  a second table, connected to the counter and comprising an input for receiving the third number, storing a second binary pattern for each possible value of the third number, with said second table able to deliver a second bit corresponding to the bit whose position in the second binary pattern corresponding to the third number received is equal to the sequential number;
  an adder, working together with the first and second tables as well as with the means for requantization, able to deliver the third word by:
    adding a least significant bit to the first word if the first bit extracted from the first table of data is equal to 1;
    subtracting a least significant bit from the first word if the second bit extracted from the second table of data is equal to 1.

As a result, the second table comprises a large number of 0 digits. A result of this characteristic is that its hardware implementation requires little resources and can therefore be realized effectively and efficiently.

A second aspect of the invention proposes a requantization process comprising the following steps:
  /a/ during a first period of time, a first word encoded in a first whole number of bits is received;
  /b/ the first word is requantized, at a given quantization step size, into a second word in a second whole number of bits strictly less than the first whole number;
  /c/ a third number is calculated that is equal to the value of a fourth number of least significant bits of the first word, with the fourth number being equal to the difference between the first whole number and the second whole number;
  /d/ during a fourth number of periods of time following the first period of time, a sequence of third words is outputted comprising a first group comprising a number of third words that is equal to the third number and a second group of third words distinct from the first group, the third words of the first group each being equal to the second word to which a least significant bit was added, the third words of the second group each being equal to the second word for the current period of time, a least significant bit being subtracted from or added to a subset of third words of the second group such that as many least significant bits are added as are subtracted.

In an embodiment of the process of the second aspect of the invention, during the step /d/,
  a sequential number is associated with the current period of time;
  a first bit is extracted corresponding to the bit whose position, in a first binary pattern corresponding to the third number received, is equal to the sequential number;
  a second bit is extracted corresponding to the bit whose position, in a second binary pattern corresponding to the third number received, is equal to the sequential number;
  the third word is calculated by:
    adding a least significant bit to the first word if the first bit is equal to 1;
    subtracting a least significant bit from the first word if the second bit is equal to 1.

The first and second binary patterns, for a given value of the third number, can in particular be obtained by:
  determining a base pattern constructed by including in said pattern a number of 1 digits that is equal to the value of the third number;
  uniformly distributing the 0 and 1 digits of the base pattern to obtain a new intermediate pattern;
  constructing a combined pattern by replacing all the 1 digits of said intermediate patterns with a 1 digit followed by the sub-pattern −1 then 1, the sub-pattern being repeated as many times as possible while maintaining a predominant number of 0 digits in the combined pattern;
  replacing, in the combined pattern, the −1 digits with the 0 digit in order to obtain the first binary pattern;
  replacing, in the combined pattern, the −1 digits with the 1 digit and the 1 digits with the 0 digit in order to obtain the second binary pattern.

For a given value of the third number that is strictly greater than two to the power of the fourth number minus one, the first pattern corresponding to said value of the third number can for example be calculated such that it is equal to the second pattern corresponding to the value of the difference between two to the power of the fourth number minus one and the value of the third number. Similarly, the second pattern corresponding to said value of the third number can then be selected so as to be equal to the first pattern corresponding to the value of the difference between two to the power of the fourth number minus one and the value of the third number. In this case, a least significant bit is added to the third word before any other addition or subtraction.

A third aspect of the invention proposes a switched-mode power supply able to output an electrical voltage signal. It comprises:
  a controller comprising an input for receiving the voltage and a reference voltage, and an output for outputting a control signal, with the controller additionally comprising an analog-to-digital converter, a regulator implementing a control law, and a waveform generator;
  a voltage generator able to produce the electrical voltage signal as a function of the control signal.

The power supply comprises a requantization device according to the first aspect of the invention, whose input is connected to an output of the regulator and whose output is connected to the input of the waveform generator.

A fourth aspect of the invention proposes a computer program comprising instructions for implementing the process according to the second aspect of the invention when said program is executed by a processor.

A fifth aspect of the invention proposes electronic equipment comprising a device according to the first aspect of the invention.

BRIEF DESCRIPTION OF THE DRAWINGS

Other features and advantages of the invention will become apparent from reading the following description. This description is purely illustrative and is to be read in light of the attached drawings, in which:

FIG. 1, already discussed, is a schematic diagram of a switched-mode power supply;

FIG. 2 is a block diagram of a requantization circuit incorporating dithering according to the principle used by embodiments of the invention; and FIG. 3 is a block diagram of an example of a requantization process according to the invention, which requantizes a digital word W encoded in a number $I_M$ of bits into a digital word x' encoded in a number $I_x$ of bits, where $I_x<I_M$.

DETAILED DESCRIPTION OF EMBODIMENTS

FIG. 2 shows a block diagram of a requantization circuit incorporating dithering according to the principle used by embodiments of the invention.

The requantization circuit comprises an input 50 for receiving an input sequence $SEQ_{in}$ subdivided into periods of time T during which a digital word W encoded in a whole number $I_M$ of bits is received. It also comprises an output 52 outputting a sequence $SEQ_{out}$ subdivided into periods of time T comprising digital words x' each encoded in a whole number $I_x$ of bits strictly less than $I_M$. The requantization circuit therefore allows requantizing digital words M encoded in a given number of bits into digital words x' encoded in a smaller number of bits.

The input sequence $SEQ_{in}$ is typically provided by the regulator 10 of the switched-mode power supply 1 or alternatively by the digital signal output from the analog-to-digital converter 12.

The output sequence $SEQ_{out}$ can advantageously be directed to the input of the waveform generator 16.

In the present description, and unless specifically indicated otherwise, the least significant bit, commonly known by the acronym LSB, corresponds, for a binary number, to the bit representing the smallest quantity, typically the rightmost bit in the usual representation.

The requantization circuit comprises a first truncation unit 54, connected to the input 50, for extracting from each word W of the input sequence $SEQ_{in}$ the $I_x$ most significant bits and thus forming the word x encoded in $I_x$ bits. The first truncation unit 54 therefore allows requantizing, at a given quantization step size n, the word W in the whole number $I_x$ of bits strictly less than the whole number $I_M$.

Similarly, the quantization circuit comprises a second truncation unit 56, connected to the input 50, allowing the calculation of the requantization error introduced by the first truncation unit 54. The second truncation unit 56 is able to produce a whole number y equal to the value of the number $I_y=I_M-I_x$ of least significant bits of the word W. For example, if $I_y=3$, the value y corresponds to the value of the 3 least significant bits of the word W.

The quantization circuit comprises a counter 59 for associating a sequential number i, which is between 0 and $2^{I_y}-1$, with the current period of time T for the input sequence $SEQ_{in}$. For example, for $I_y=3$, the counter 59 allows sequentially associating a sequential number which is between 0 and 7 with each period of time T of the input sequence $SEQ_{in}$. The counter 59 therefore calculates the modulus $2^{I_y}$ of the position of the current period of time T in the input sequence $SEQ_{in}$. The counter 59 outputs the sequential number i of the current period of time T.

The quantization circuit comprises two tables of data 58 connected to the counter 59. Each is constructed to allow storing a binary sequence d formed of $2^{k_y}$ bits, called a pattern, for each possible value of y. Each table of data 58 is connected to the second truncation unit 56 so as to receive the value y as input. As a function of the value of y, the first table of data 58a outputs a bit $b_1$ corresponding to the bit whose position in the pattern $d_1$ corresponding to the value y is equal to the sequential number i of the counter 59. Similarly, the second table of data 58b outputs a bit $b_2$ corresponding to the bit whose position in the pattern $d_2$ corresponding to the value y is equal to the sequential number i of the counter 59.

The quantization circuit additionally comprises an adder 60 comprising a first input 62 connected to the output of the first truncation unit 54, a second input 64 connected to the output of the first table of data 58a, and a third input 66 connected to the output of the second table of data 58b. The adder 60 is a saturating adder for example, thus avoiding overflow or underflow. The output from the adder 60 is connected to the output 52 of the quantization circuit to which it delivers the word x' obtained by:

adding a least significant bit to the word x if the bit $b_1$ extracted from the first table of data 58a is equal to 1; this is called additive correction;

subtracting a least significant bit from the word x if the bit $b_2$ extracted from the second table of data 58b is equal to 1; this is called subtractive correction.

The patterns $d_1$ and $d_2$ are chosen such that, at the output from the adder 60, while considering the $2^{I_y}$ periods following the period during which the word W was received:

additive corrections are applied to a first group comprising a number, equal to the value y, of third words x', with said third words x' not necessarily being contiguous over time; thus, on the average for the $2^{I_y}$ periods considered, the quantization error is compensated; and a whole number p of additive corrections and a same number p of subtractive corrections are applied to a second group of third words x', distinct from the first group; thus the sum of the least significant bits added to and subtracted from the third words x' of the second group is zero.

For clarity in the present description, only the case concerning the use of two tables of data is described. However, based on the information disclosed herein and on general technical knowledge, a person skilled in the art would have no difficulty in extending this case to a combination of a greater number of patterns distributed into more than two tables of data 58.

FIG. 3 is a block diagram of an example of a requantization process according to the invention, which requantizes a digital word W encoded in $I_M$ bits into a digital word x' encoded in $I_x$ bits, where $I_x<I_M$.

In a first step 100, a digital word W is received during an initial period.

Then in a second step 110, the word W is requantized, at a given quantization step size n, into a word x in a whole number $I_x$ of bits that is strictly less than the whole number $I_M$. To do this, the most significant bits $I_x$ are extracted from the word W to form a word x encoded in $I_x$ bits In a third step 120, the whole number y equal to the value of the number $I_y=I_M-I_x$ of least significant bits of the word W is calculated.

In a fourth step 130, a sequence of words x' subdivided into a first group and a second group is output during $2^{I_y}$ periods following the initial period. The first group comprises a number equal to the value of y of words x'. The second group of words x' is distinct from the first group. The words x' of the first group are each equal to the word x to which a least significant bit was added. The words x of the second group are each equal to the word x, with a least significant bit subtracted or added to a subset of words x' of the second group such that as many least significant bits are added as are subtracted.

In one embodiment of the process, during the fourth step 130, a sequential number is associated with the current period of time. Then the following are extracted:
  a first bit $b_1$ corresponding to the bit whose position, in a first binary pattern $d_1$ corresponding to the number y received, is equal to the sequential number i;
  a second bit $b_2$ corresponding to the bit whose position, in a second binary pattern $d_2$ corresponding to the number y received, is equal to the sequential number i.

The word x' is calculated by:
  adding a least significant bit to the word x if the first bit $b_1$ is equal to 1;
  subtracting a least significant bit from the word x if the second bit $b_2$ is equal to 1.

In a particular embodiment, each pattern d is typically constructed in two steps. First, base patterns $d_b$ that are $2^{l_y}$ bits long are constructed, for each possible value of y, by including a number of 1 digits in said pattern $d_b$ equal to the whole number y and by uniformly distributing the 0 and 1 digits in the base pattern $d_b$. For $I_y=4$, for example, the following table 1 is obtained for the first $2^{l_y-1}$ possible values of y:

TABLE 1

| Value of y | $d_b$ |
|---|---|
| 0 | 0000000000000000 |
| 1 | 0000000100000000 |
| 2 | 0000010000000100 |
| 3 | 0001000000100001 |
| 4 | 0001000100010001 |
| 5 | 0001001001001001 |
| 6 | 0010010100100101 |
| 7 | 0010101001010101 |
| 8 | 0101010101010101 |

Second, a combined pattern $d_c$ that is $2^{l_y}$ bits long is constructed, for the first $2^{l_y-1}$ base patterns $d_b$ each corresponding to a value of y contained within the interval $\lfloor 0, 2^{l_y-1} \rfloor$, by replacing all the 1 digits of said base patterns $d_b$ with the same sequence of digits "1(−1 1)*", the subsequence "(−1 1)" being repeated as many times as possible while maintaining the predominance of 0 digits in the combined pattern $d_b$. In the present description, the notation "1(−1 1)*" is an extended regular expression ERE. The table 2 below is obtained, for the first $2^{l_y-1}$ possible values of y:

TABLE 2

| Value of y | $d_c$ |
|---|---|
| 0 | 0000000000000000 |
| 1 | 00000001−1 1−1 1−1 1−1 1 |
| 2 | 000001−1 1000001−1 1 |
| 3 | 0001−1 10000100001 |
| 4 | 0001000100010001 |
| 5 | 0001001001001001 |
| 6 | 0010010100100101 |
| 7 | 0010101001010101 |
| 8 | 0101010101010101 |

Next the first table of data 58a is constructed by associating with each value of y the pattern $d_1$ formed by the corresponding combined pattern $d_c$ in which all the −1 digits are replaced by the 0 digit. Similarly, the second table of data 58b is constructed by associating with each value of y the pattern $d_2$ formed by the corresponding combined pattern $d_c$ in which all the −1 digits are replaced by the 1 digit, and all the 1 digits by the 0 digit.

The following table for example is then obtained, for the first $2^{l_y-1}$ possible values of y:

TABLE 3

| Value of y | $d_1$ | $d_2$ |
|---|---|---|
| 0 | 0000000000000000 | 0000000000000000 |
| 1 | 0000000101010101 | 0000000010101010 |
| 2 | 0000010100000101 | 0000001000000010 |
| 3 | 0001010000100001 | 0000100000000000 |
| 4 | 0001000100010001 | 0000000000000000 |
| 5 | 0001001001001001 | 0000000000000000 |
| 6 | 0010010100100101 | 0000000000000000 |
| 7 | 0010101001010101 | 0000000000000000 |
| 8 | 0101010101010101 | 0000000000000000 |

For each value of y contained within the interval $\lfloor 2^{l_y-1}+1, 2^{l_y} \rfloor$, the pattern $d_1$ corresponding to said value of y is equal to the pattern $d_2$ corresponding to the value $2^{l_y}-y$. Similarly, for each value of y contained within the interval $\lfloor 2^{l_y-1}+1, 2^{l_y} \rfloor$, the pattern $d_2$ corresponding to said value of y is equal to the pattern $d_1$ corresponding to the value $2^{l_y}-y$. The following table is then obtained, for the values of y contained within the interval $\lfloor 2^{l_y-1}+1, 2^{l_y} \rfloor$:

TABLE 4

| Value of y | $d_1$ | $d_2$ |
|---|---|---|
| 9 | 0000000000000000 | 0010101001010101 |
| 10 | 0000000000000000 | 0010010100100101 |
| 11 | 0000000000000000 | 0001001001001001 |
| 12 | 0000000000000000 | 0001000100010001 |
| 13 | 0000100000000000 | 0001010000100001 |
| 14 | 0000001000000010 | 0000010100000101 |
| 15 | 0000000010101010 | 0000000101010101 |

In this particular embodiment, when the value of y is contained within the interval $\lfloor 2^{l_y-1}+1, 2^{l_y} \rfloor$, the adder 60 systematically adds a least significant bit to the third words x' before any other addition or subtraction.

One should note that it is possible to store in the first table of data 58a and in the second table of data 58b all the patterns $d_1$ and $d_2$ for all the values of y contained within the interval $\lfloor 0, 2^{l_y} \rfloor$. Alternatively, it is possible to store only the patterns $d_1$ and $d_2$ for all values of y contained within the interval $$\left[ 0, \frac{2^{l_y}}{2} + 1 \right]$$

and to implement a means for dynamically calculating the patterns $d_1$ and $d_2$ for all the value of y contained with the interval $$\left[ \frac{2^{l_y}}{2} + 1, 2^{l_y} \right].$$

The process of the invention can in particular be implemented in an electronic circuit, or in the form of a computer program comprising instructions for implementing the process of the invention when said program is executed by a processor. The process applies in general to any application requiring the quantization of a digital word W encoded in $I_M$ bits into a digital word x' encoded in $I_x$ bits, where $I_x < I_M$.

The invention claimed is:
1. A requantization device comprising:
   an input for receiving, in a first period of time, a first word encoded in a first whole number of bits;

a first truncation unit for requantization, at a given quantization step size, of the first word into a second word in a second whole number of bits that is strictly less than the first whole number;
a second truncation unit for determining a third number equal to the value of a fourth number of least significant bits of the first word, with the fourth number being equal to the difference between the first whole number and the second whole number;
an output for outputting, during a fourth number of periods following the first period of time, a sequence of third words each equal to the second word for the current period of time, with the sequence comprising a first group comprising a number of third words that is equal to the third number and a second group of third words distinct from the first group; and
a correction unit configured to:
add a least significant bit to the third words of the first group before outputting the third words;
add or subtract least significant bits to/from the third words of the second group before outputting the third words, such that the sum of the least significant bits added to and subtracted from the third words of the second group is zero.

2. A device according to claim 1, wherein the correction unit comprises:
a counter for associating a sequential number with the current period of time;
a first table, connected to the counter and comprising an input for receiving the third number, storing a first binary pattern for each possible value of the third number, with said first table able to deliver a first bit corresponding to the bit whose position in the first binary pattern corresponding to the third number received is equal to the sequential number;
a second table, connected to the counter and comprising an input for receiving the third number, storing a second binary pattern for each possible value of the third number, with said second table able to deliver a second bit corresponding to the bit whose position in the second binary pattern corresponding to the third number received is equal to the sequential number; and
an adder, working together with the first and the second tables as well as with the first truncation unit for requantization, able to deliver the third word by:
adding a least significant bit to the first word if the first bit extracted from the first table of data is equal to 1;
subtracting a least significant bit from the first word if the second bit extracted from the second table of data is equal to 1.

3. A requantization process comprising:
a. during a first period of time, a first word encoded in a first whole number of bits is received;
b. the first word is requantized, at a given quantization step size, into a second word in a second whole number of bits that is strictly less than the first whole number;
c. a third number is calculated that is equal to the value of a fourth number of least significant bits of the first word, with the fourth number being equal to the difference between the first whole number and the second whole number; and
d. during a fourth number of periods of time following the first period of time, a sequence of third words is outputted comprising a first group comprising a number of third words that is equal to the third number and a second group of third words distinct from the first group, with the third words of the first group each being equal to the second word to which a least significant bit was added, the third words of the second group each being equal to the second word for the current period of time, a least significant bit being subtracted from or added to a subset of third words of the second group such that as many least significant bits are added as are subtracted.

4. A process according to claim 3, wherein during the step d,
a sequential number is associated with the current period of time;
a first bit is extracted corresponding to the bit whose position, in a first binary pattern corresponding to the third number received, is equal to the sequential number;
a second bit is extracted corresponding to the bit whose position, in a second binary pattern corresponding to the third number received, is equal to the sequential number; and
the third word is calculated by:
adding a least significant bit to the first word if the first bit is equal to 1;
subtracting a least significant bit from the first word if the second bit is equal to 1.

5. A process according to claim 4, wherein the first and second binary patterns, for a given value of the third number, are obtained by:
determining a base pattern constructed by including in said pattern a number of 1 digits that is equal to the value of the third number and uniformly distributing the 0 and 1 digits of the base pattern;
constructing a combined pattern by replacing all the 1 digits of the base pattern with a 1 digit followed by the sub-pattern −1 then 1, the sub-pattern being repeated as many times as possible while maintaining a predominant number of 0 digits in the combined pattern;
replacing, in the combined pattern, the −1 digits with the 0 digit in order to obtain the first binary pattern; and
replacing, in the combined pattern, the −1 digits with the 1 digit and the 1 digits with the 0 digit in order to obtain the second binary pattern.

6. A process according to claim 5, wherein, for a given value of the third number that is strictly greater than two to the power of the fourth number minus one, the first pattern corresponding to said value of the third number is equal to the second pattern corresponding to the value of the difference between two to the power of the fourth number minus one and the value of the third number, the second pattern corresponding to said value of the third number being equal to the first pattern corresponding to the value of the difference between two to the power of the fourth number minus one and the value of the third number, with a least significant bit being added to the third word before any other addition or subtraction.

7. A switched-mode power supply to output an electrical voltage signal, comprising:
a controller comprising an input for receiving the voltage and a reference voltage, and an output for outputting a control signal, with the controller additionally comprising an analog-to-digital converter, a regulator implementing a control law, and a waveform generator;
a voltage generator to produce the electrical voltage signal as a function of the control signal; and
a requantization device comprising:
an input connected to an output of the regulator for receiving, in a first period of time, a first word encoded in a first whole number of bits;
a first truncation unit for requantization, at a given quantization step size, of the first word into a second word in a second whole number of bits that is strictly less than the first whole number;

a second truncation unit for determining a third number equal to the value of a fourth number of least significant bits of the first word, with the fourth number being equal to the difference between the first whole number and the second whole number;

an output connected to an input of the waveform generator for outputting, during a fourth number of periods following the first period of time, a sequence of third words each equal to the second word for the current period of time, with the sequence comprising a first group comprising a number of third words that is equal to the third number and a second group of third words distinct from the first group;

a correction unit configured to:

add a least significant bit to the third words of the first group before outputting the third words;

add or subtract least significant bits to/from the third words of the second group before outputting the third words, such that the sum of the least significant bits added to and subtracted from the third words of the second group is zero.

8. A computer program product stored on a computer readable medium that stores computer-executable process steps for a requantization process, said computer-executable process steps causing a processor to perform the steps of:

a. during a first period of time, a first word encoded in a first whole number of bits is received;

b. the first word is requantized, at a given quantization step size, into a second word in a second whole number of bits that is strictly less than the first whole number;

c. a third number is calculated that is equal to the value of a fourth number of least significant bits of the first word, with the fourth number being equal to the difference between the first whole number and the second whole number; and d. during a fourth number of periods of time following the first period of time, a sequence of third words is outputted comprising a first group comprising a number of third words that is equal to the third number and a second group of third words distinct from the first group, with the third words of the first group each being equal to the second word to which a least significant bit was added, the third words of the second group each being equal to the second word for the current period of time, a least significant bit being subtracted from or added to a subset of third words of the second group such that as many least significant bits are added as are subtracted.

9. An electronic equipment comprising:

a requantization device comprising:

an input for receiving, in a first period of time, a first word encoded in a first whole number of bits;

a first truncation unit for requantization, at a given quantization step size, of the first word into a second word in a second whole number of bits that is strictly less than the first whole number;

a second truncation unit for determining a third number equal to the value of a fourth number of least significant bits of the first word, with the fourth number being equal to the difference between the first whole number and the second whole number;

an output for outputting, during a fourth number of periods following the first period of time, a sequence of third words each equal to the second word for the current period of time, with the sequence comprising a first group comprising a number of third words that is equal to the third number and a second group of third words distinct from the first group;

a correction unit configured to:

add a least significant bit to the third words of the first group before outputting the third words;

add or subtract least significant bits to/from the third words of the second group before outputting the third words, such that the sum of the least significant bits added to and subtracted from the third words of the second group is zero.

\* \* \* \* \*